United States Patent
Fluri et al.

(10) Patent No.: US 10,514,395 B2
(45) Date of Patent: Dec. 24, 2019

(54) METHOD AND SYSTEM FOR INSULATING AN RC VOLTAGE DIVIDER WITH AN ACTIVE PART IN OIL AND AN OUTER PART IN GAS

(71) Applicant: SIEMENS AKTIENGESELLSCHAFT, Munich (DE)

(72) Inventors: Rolf Fluri, Basel (CH); Joachim Schmid, Efringen-Kirchen (DE)

(73) Assignee: Siemens Aktiengesellschaft, Munich (DE)

( * ) Notice: Subject to any disclaimer, the term of this patent is extended or adjusted under 35 U.S.C. 154(b) by 313 days.

(21) Appl. No.: 15/507,265

(22) PCT Filed: Jun. 12, 2015

(86) PCT No.: PCT/EP2015/063223
§ 371 (c)(1),
(2) Date: Feb. 28, 2017

(87) PCT Pub. No.: WO2016/030035
PCT Pub. Date: Mar. 3, 2016

(65) Prior Publication Data
US 2017/0285073 A1  Oct. 5, 2017

(30) Foreign Application Priority Data
Aug. 29, 2014 (EP) .................. 14182903

(51) Int. Cl.
*G01R 15/06* (2006.01)
*H02B 13/035* (2006.01)
*G01R 1/04* (2006.01)

(52) U.S. Cl.
CPC ......... *G01R 15/06* (2013.01); *H02B 13/0356* (2013.01); *G01R 1/0416* (2013.01)

(58) Field of Classification Search
None
See application file for complete search history.

(56) References Cited

U.S. PATENT DOCUMENTS

| | | | |
|---|---|---|---|
| 4,329,638 A | 5/1982 | Le Maguet | |
| 6,563,908 B1 | 5/2003 | Enck, Jr. | |
| 6,642,829 B1 | 11/2003 | Carmena | |
| 8,466,385 B1 * | 6/2013 | Glaser | H01H 33/6661 218/140 |

(Continued)

FOREIGN PATENT DOCUMENTS

| | | |
|---|---|---|
| CH | 343528 A | 12/1959 |
| CN | 2125831 U | 12/1992 |

(Continued)

*Primary Examiner* — Paresh Patel
(74) *Attorney, Agent, or Firm* — Laurence Greenberg; Werner Stemer; Ralph Locher

(57) ABSTRACT

A method for insulating an RC voltage divider includes installing at least one part of an active part of the voltage divider within an inner housing and insulating the at least one part of the active part with an insulating oil within the inner housing, hermetically sealing the inner housing, enclosing the inner housing in an outer housing and filling a space between the inner housing and the outer housing with an insulating gas. A system for insulating an RC voltage divider is also provided.

12 Claims, 2 Drawing Sheets

(56) References Cited

U.S. PATENT DOCUMENTS 8,471,166 B1 * 6/2013 Glaser .................. H01H 33/666
                                                                218/124
2013/0099773 A1    4/2013 Wildermuth et al.

FOREIGN PATENT DOCUMENTS

| CN | 1967265    | A  | 5/2007  |
|----|------------|----|---------|
| CN | 101074972  | A  | 11/2007 |
| CN | 202837419  | U  | 3/2013  |
| DE | 2037828    | A1 | 2/1972  |
| DE | 2841466    | A1 | 4/1980  |
| DE | 19841164   | A1 | 3/2000  |
| EP | 1018024    | B1 | 11/2001 |
| JP | S59138960  | A  | 8/1984  |
| JP | H06204049  | A  | 7/1994  |
| JP | 2010539668 | A  | 12/2010 |
| RU | 2297063    | C2 | 4/2007  |

* cited by examiner

METHOD AND SYSTEM FOR INSULATING AN RC VOLTAGE DIVIDER WITH AN ACTIVE PART IN OIL AND AN OUTER PART IN GAS

BACKGROUND OF THE INVENTION

Field of the Invention

The invention relates to the technical field of RC voltage dividers.

State of the art is a solution where the whole active part of an RC voltage divider is built into an external housing and (SF6) gas. The active part of the RC voltage divider may be a stack of several smaller active parts. The external housing usually comprises porcelain or a composite insulator for Air Insulated Switchgear (AIS) or metallic housing for Gas Insulating Switchgear (GIS).

FIG. 1 shows a conventional RC voltage divider 100 used in GIS that is purely SF6 insulated due to general customer requirements. No oil insulated active parts were allowed due to fear of leaking oil into the gas compartment. The voltage divider 100 comprises an insulator 109 with a diameter d including the high voltage terminal 110, an active part 102, a housing 104, a stack of flat pressed capacitance elements 105, and a stack of parallel grading resistors 107, and a valve 112. The active part 102 comprises the stack of flat pressed capacitance elements 105 and the stack of parallel grading resistors 107, and extends along the length l. The insulator 109 closes and seals the housing 104 to the GIS at which the voltage divider will be connected. The insulator 109 comprises the input port 110 for connecting the voltage divider 100 to a high voltage tension, while the output port 111 generates a low voltage output. The housing 104 encloses the active part 102, the stack of flat pressed capacitance elements 5, and the stack of parallel grading resistors 107. Along the active part 102, the housing 104 has a diameter that is larger than the diameter of the connector d. The valve 112 serves for evacuating e.g. atmospheric gas from the space enclosed by the housing 104, and for refilling said space with an insulating gas in order to achieve a high level of uncontaminated insulating gas within the housing 104.

It is also known to apply non-encapsulated RC voltage dividers in a gas insulated switchgear (GIS). This means that the voltage divider and the entire switchgear are built into a housing that is filled for example with SF6. Such non-encapsulated SF6 insulated RC Voltage Dividers for GIS applications are susceptible to environmental influences like dust, humidity and pollution from handling. Non-encapsulated units may also not be pretested with the rated test voltage until the final assembling. SF6 insulated active parts have lower dielectric strength and lower capacitance compared to oil insulated and therefore require more space for the over-all voltage divider. On the other hand, using oil as a means for isolating the active part results in the drawback of increased weight, due to the high density of oil compared to an insulation based on gas, such as SF6.

BRIEF SUMMARY OF THE INVENTION

It is therefore the objective of the present invention to provide an RC voltage divider with good insulation properties, and optimized weight and volume requirements.

This objective is solved by the solutions proposed on the basis of the independent claims. Further advantageous embodiments are proposed by the independent claims.

According to an aspect, a method for insulating an RC voltage divider 1 is proposed. At least a part of an active part 2 of the voltage divider 1 is installed within an inner housing 3 and insulated with an insulating oil within the inner housing 3. The inner housing is hermetically sealed. The hermetically sealed inner housing is enclosed in an outer housing 4. A space 6 between the inner housing 3 and the outer housing 4 is filled with an insulating gas.

According to an aspect, a system 10 for insulating an RC voltage divider 1 is presented. The system comprises an inner housing 3 and an outer housing 4. The inner housing 3 is adapted to hermetically seal at least a part of an active part 2 of the voltage divider 1. The active part 2 is insulated by means of an insulating oil within the inner housing 3. The inner housing 3 is enclosed within the outer housing 4. A space 6 between the inner housing 3 and the outer housing 4 is filled by means of an insulating gas.

BRIEF DESCRIPTION OF THE SEVERAL VIEWS OF THE DRAWING

In the following the invention is described on the basis of embodiments illustrated on the basis of the figures.

DESCRIPTION OF THE INVENTION

Figure 2:
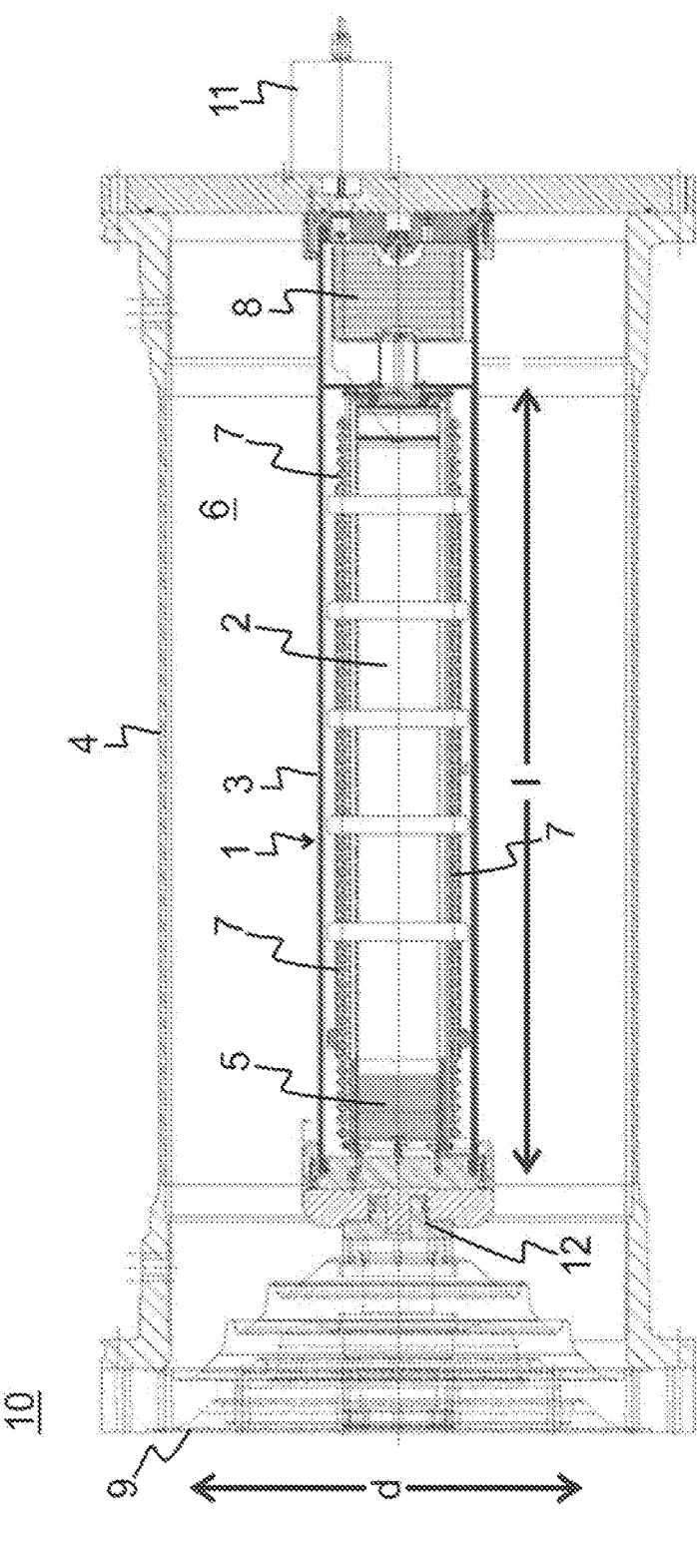
FIG. 2 shows a system for insulating a voltage divider according to an embodiment of the invention.

FIG. 2 shows a system 10 for insulating a voltage divider 1 according to an embodiment of the invention. The system 10 comprises the voltage divider 1, an inner housing 3, an outer housing 4, a stack of flat pressed capacitance elements 5, parallel grading resistors 7, a compensating means 8, an insulator 9 which insulates a high voltage input port 12, and a low voltage output port 11. The voltage divider 1 comprises an active part 2, at least the inner housing 3, the stack of flat pressed capacitance elements 5, the parallel grading resistors 7, the input port 12, the output port 11, and the compensating means 8. The active part 2 comprises the stack of flat pressed capacitance elements 5 and the stack of parallel grading resistors 7, and extends along the length l. For the sake of better visibility of other parts in FIG. 2, the capacitance elements 105 are not drawn and indicated over the entire length l of the active part, but only over the left part of it. However, capacitance elements 5 as well as resistors 7 are preferably stacked over most of or the entire length l of the active part 2.

The inner housing 3 is adapted to hermetically seal at least a part of an active part 2 of the voltage divider 1. The inner housing 3 can therefore be adapted to hermetically seal a part of the active part 2 of the voltage divider 1 or the entire active part 2. At least said part of the active part 2 is insulated by means of an insulating oil within the inner housing 3. The inner housing 3 is enclosed within the outer housing 4. A space 6 between the inner housing 3 and the outer housing 4 is filled by means of an insulating gas. Preferably all the space between the inner housing 3 and the outer housing 4 is filled by means of insulating gas.

According to an embodiment, the RC voltage divider 1 is insulated. Therefore, at least a part of an active part 2 of the voltage divider 1 is installed within the inner housing 3. The part of the active part is insulated, and preferably impregnated, with the insulating oil within the inner housing 3. This can for example be done by filling the inner housing 3 with an insulating oil. The inner housing 3 is then hermetically sealed, such that the inner housing and the parts contained by the inner housing form a unit that can easily be transported and handled. For example, such a unit can be transported from a factory to the switchgear manufacturer, where it is then enclosed in an outer housing 4. The space 6 between the inner housing 3 and the outer housing 5 is then filled with an insulating gas, e.g. by filling the outer housing 4 with the insulting gas. The outer housing is connected to the GIS with a flange at the side of the insulator 9. The insulator 9 does not need to seal the outer housing, so that the outer housing can form a single gas compartment together with other parts of the GIS.

Figure 1:
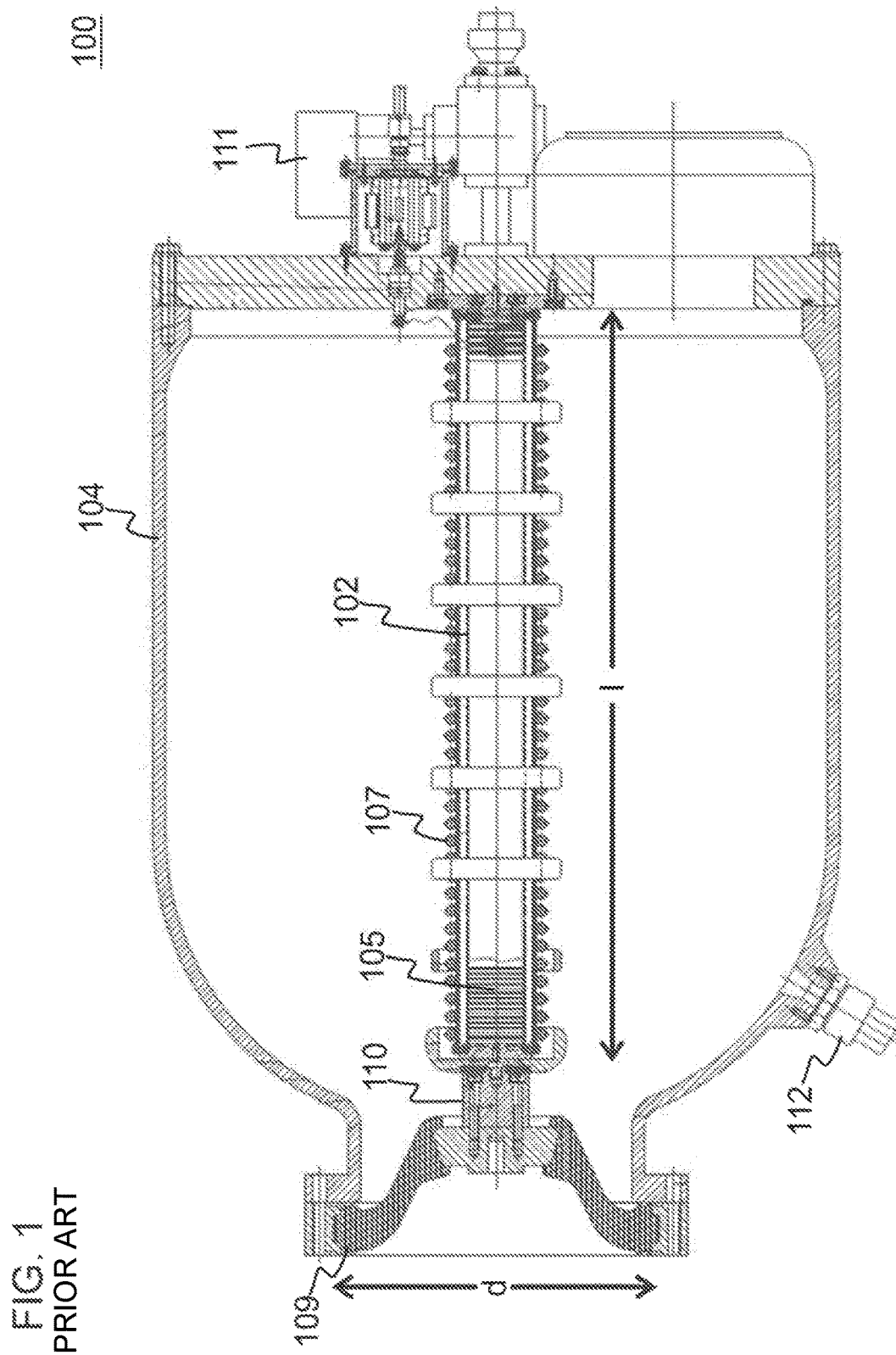
FIG. 1 shows a voltage divider 1 according to the state of the art.

Embodiments of the invention result in a number of synergetic effects: In addition to good insulation properties, and optimized weight and volume requirements, such a voltage divider is easy to handle and to mount. The reason for that is that the unit formed by the inner housing 3 and the parts contained within the inner housing and insulated by the insulating oil can be easily handled and mounted as one finished unit that needs not to be disassembled and reassembled when installed, e.g. in a GIS. Moreover, compared to the state of the art solution of FIG. 1, it is not necessary to extremely properly evacuate the entire gaseous content of the housing 104, before filling it with gas, in order to ensure high purity of the insulating gas. The reason for that is that when operative, the active part 102 can get damaged during operation when the insulating gas comprises contaminants, such as dust, moister or air. In the solution shown in FIG. 2, due to the insulation with the insulating oil within the inner housing, much lower purity for the insulating gas is necessary.

As insulating gas for example SF6 or some gas mixture comprising SF6 can be used. As insulating oil e.g. mineral oil or synthetic oil can be used.

According to an embodiment, the outer housing 4 is a standard housing of a GIS. In such an embodiment, the system 10 can be a part of a GIS. The outer housing 4 can also be used as housing for other parts of a GIS, such as connecting conductor, arrester, or others. This can be additionally advantageous since no specific housing for the voltage divider has to be designed.

According to the embodiment shown in FIG. 2, the outer housing 4 is cylindrical, and has a diameter d corresponding to the diameter of an external connector for the voltage divider 1. Compared to the prior art solution shown in FIG. 1, cylindrical designs are more easily to be achieved for a given standardized connector with the given diameter d, when using a solution with oil isolation within an inner housing and gas insulation within an outer housing, since less volume is required for achieving minimum insulation requirements. In the prior art solution shown in FIG. 1 the housing 104 is not cylindrical since the given diameter d for connection to the GIS is not sufficiently large to secure insulation over the entire length of the active part 102. However, of course, according to other embodiments of the invention than the ones illustrated on the basis of FIG. 2, also non-cylindrical outer housings can be used.

Due to the atmospheric conditions the voltage divider 1 can have different temperatures from below freezing point up to e.g. 80° C. Additional heating from the switchgear can influence the temperature range to which the voltage divider 1 is exposed. Therefore the system 10 comprises a compensation means 8 for compensating the temperature induced volume dilations of the insulating oil. This compensation means is a flexible containment inside the oil volume, filled with gas, so that the volume change of the oil can be compensated.

According to other preferred embodiments, each phase of a high voltage network comprises an RC voltage divider 1 that consists of a primary and a secondary RC-part. The primary part, which is the high voltage part, is a stack of flat pressed capacitance elements with a parallel grading resistor. According to an embodiment of the invention this RC-stack is built in a hermetically sealed housing, for example a Fibre-reinforced plastic-tube, and impregnated with oil. The oil encapsulated design needs less than two third of the space (in volume) which is necessary with an open and SF6 insulated solution. Therefore also a cost advantage results. An encapsulated oil solution is less sensitive to environmental influences and can be pretested with the full rated test voltage. Once tested, the unit can be handled and stored easily and safe.

The invention claimed is:

1. A method for insulating an RC voltage divider, the method comprising the following steps:
providing an active part of the voltage divider including a stack of flat pressed capacitance elements and a stack of parallel grading resistors;
entirely installing the active part within an inner housing;
insulating the active part with an insulating oil within the inner housing;
hermetically sealing the inner housing entirely containing the active part;
enclosing the inner housing in an outer housing; and
filling a space between the inner housing and the outer housing with an insulating gas.

2. The method according to claim 1, which further comprises providing at least one of $SF_6$ as the insulating gas or mineral oil or a synthetic oil as the insulating oil.

3. The method according to claim 1, wherein the outer housing is a switchgear housing.

4. The method according to claim 1, wherein the outer housing is a housing of the RC voltage divider.

5. The method according to claim 1, wherein the outer housing is cylindrical and has a diameter corresponding to a diameter of an external connector for the voltage divider.

6. The method according to claim 1, which further comprises providing the voltage divider with a compensating device for compensating temperature induced volume dilations of the insulating oil.

7. A system for insulating an RC voltage divider, the system comprising:
an inner housing adapted to entirely receive and hermetically seal an active part of the voltage divider including a stack of flat pressed capacitance elements and a stack of parallel grading resistors:
an insulating oil disposed within said inner housing and insulating the active part;
an outer housing enclosing said inner housing and defining a space between said inner housing and said outer housing; and
an insulating gas filling said space.

8. The system according to claim 7, wherein:
said insulating gas is $SF_6$, or
said insulating oil is mineral oil or a synthetic oil, or
said insulating gas is $SF_6$ and said insulating oil is mineral oil or a synthetic oil.

9. The system according to claim 7, wherein said outer housing is a switchgear housing.

10. The system according to claim 7, wherein said outer housing is a housing of the RC voltage divider.

11. The system according to claim 7, wherein said outer housing is cylindrical and has a diameter corresponding to a diameter of an external connector for the voltage divider.

12. The system according to claim 7, wherein the voltage divider includes a compensating device for compensating temperature induced volume dilations of said insulating oil.

\* \* \* \* \*